United States Patent
Juskey et al.

(10) Patent No.: US 7,489,021 B2
(45) Date of Patent: Feb. 10, 2009

(54) LEAD FRAME WITH INCLUDED PASSIVE DEVICES

(75) Inventors: Frank J. Juskey, Apopka, FL (US); Daniel K. Lau, San Francisco, CA (US); Lawrence R. Thompson, San Jose, CA (US)

(73) Assignee: Advanced Interconnect Technologies Limited, Port Louis (MU)

( * ) Notice: Subject to any disclaimer, the term of this patent is extended or adjusted under 35 U.S.C. 154(b) by 0 days.

(21) Appl. No.: 10/563,172

(22) PCT Filed: Feb. 17, 2004
(Under 37 CFR 1.47)

(86) PCT No.: PCT/US2004/004676
§ 371 (c)(1),
(2), (4) Date: Jun. 8, 2007

(87) PCT Pub. No.: WO2004/077508
PCT Pub. Date: Sep. 10, 2004

(65) Prior Publication Data
US 2008/0036034 A1 Feb. 14, 2008

Related U.S. Application Data

(60) Provisional application No. 60/449,049, filed on Feb. 21, 2003.

(51) Int. Cl.
*H01L 23/495* (2006.01)
*H01L 23/34* (2006.01)
*H01L 21/00* (2006.01)

(52) U.S. Cl. ........... 257/666; 257/676; 257/684; 257/693; 257/698; 257/723; 257/924; 438/106; 438/123; 438/51; 438/54; 438/108

(58) Field of Classification Search .......... 257/678, 257/724, 924, E23.004, E23.031–E23.059, 257/666, 676, 684, 693, 713, 778, 723, 698; 174/527–541; 361/723, 813; 438/123, 124, 438/106, 108, 111, 329, FOR. 380, FOR. 385, 438/113, 51, 54
See application file for complete search history.

(56) References Cited

U.S. PATENT DOCUMENTS 5,229,640 A 7/1993 Pak (Continued)

FOREIGN PATENT DOCUMENTS

DE 44 10 212 A1 9/1995

(Continued)

OTHER PUBLICATIONS

European Patent Office, Supplemental European Search Report in Application No. EP 04 71 1876; Sep. 30, 2008.

*Primary Examiner*—Jasmine J Clark
(74) *Attorney, Agent, or Firm*—Wiggin and Dana LLP

(57) ABSTRACT

An semiconductor device package (10) includes a semiconductor device (die) (12) and passive devices (14) electrically connected to a common lead frame (17). The lead frame (17) is formed from a stamped and/or etched metallic structure and includes a plurality of conductive leads (16) and a plurality of interposers (20). The passive devices (14) are electrically connected to the interposers (20), and I/O pads (22) on the die (12) are electrically connected to the leads (16). The die (12), passive devices (14), and lead frame (17) are encapsulated in a molding compound (28), which forms a package body (30). Bottom surfaces (38) of the leads (16) are exposed at a bottom face (34) of the package (10).

35 Claims, 9 Drawing Sheets

U.S. PATENT DOCUMENTS

| | | |
|---|---|---|
| 6,424,034 B1 | 7/2002 | Ahn et al. |
| 6,713,317 B2 | 3/2004 | Knapp et al. |
| 2002/0135049 A1 | 9/2002 | Liu |
| 2002/0145180 A1 | 10/2002 | Terui et al. |
| 2002/0195693 A1 | 12/2002 | Liu et al. |
| 2005/0056916 A1 * | 3/2005 | Sakamoto et al. ............ 257/672 |

FOREIGN PATENT DOCUMENTS

| | | |
|---|---|---|
| JP | 59-72757 | 4/1984 |
| WO | WO 96/30943 A1 | 10/1996 |

* cited by examiner

LEAD FRAME WITH INCLUDED PASSIVE DEVICES

CROSS REFERENCE TO RELATED APPLICATIONS

This application claims the benefit of U.S. Provisional Patent Application No. 60/449,049, filed Feb. 21, 2003, which is incorporated by reference herein in its entirety.

BACKGROUND OF THE INVENTION

1. Field of the Invention

The present invention relates generally to semiconductor device packages and, more particularly, to lead frame based semiconductor device packages including at least one passive device.

2. Description of the Related Art

In a conventional semiconductor device package, a housing encases the semiconductor device (die) to prevent damage to the die from exposure to the environment. The housing may be hermetically sealed, encased in plastic, or otherwise protected from the environment.

In lead frame based semiconductor device packages, electrical signals are transmitted between at least one die and external circuitry, such as a printed circuit board, by an electrically conductive lead frame. The lead frame includes a number of leads, each having an inner lead end and an opposing outer lead end. The inner lead end is electrically connected to input/output (I/O) pads on the die, and the outer lead end provides a terminal outside of the package body. Where the outer lead end terminates at the face of the package body, the package is known as a "no-lead" package, while if the outer leads extend beyond the package body perimeter the package is referred to as "leaded". Examples of well-known no-lead packages include quad flat no-lead (QFN) packages, which have four sets of leads disposed around the perimeter of the bottom of a square package body, and dual flat no-lead (DFN) packages, which have two sets of leads disposed along opposite sides of the bottom of a package body. A method for the manufacture of a lead frame based package is disclosed in commonly owned U.S. patent application Ser. No. 10/134,882 that was filed on Apr. 29, 2002 and is incorporated by reference in its entirety herein.

In many electronic assemblies, passive components such as, for example, capacitors, inductors and resistors, are interconnected with semiconductor device packages to provide desired functions. Heretofore, most of these passive components could not be integrated within an encased die package in a cost effective manner.

It is desirable from both a manufacturer's and user's standpoint that electronic assemblies require as few as possible external connections since such connections increase manufacturing costs (that are ultimately passed to the user) and can introduce noise to the package as signals are propagated from external components.

Accordingly, the inventors have realized that a need exists for an improved semiconductor device package including a cost effective method for placing passive components close to a die and for encasing the passive components and die in a single package.

BRIEF SUMMARY OF THE INVENTION

The above-described and other drawbacks and deficiencies of the prior art are overcome or alleviated by a semiconductor device package, comprising: a package body; a semiconductor device disposed within the package body; at least one passive device disposed within the package body; and a lead frame formed from electrically conductive material. The lead frame includes a plurality of leads electrically connected to I/O pads on the semiconductor device, a first surface exposed from the package body, and a plurality of first interposers electrically connected to the at least one passive device. The at least one passive device may be selected from capacitors; inductors and resistors. The package body may be formed by a mold compound encapsulating at least a portion of the semiconductor die, at least a portion of the at least one passive component, and at least a portion of the lead frame. The leads may be exposed substantially coplanar with a surface of the package body.

The I/O pads on the semiconductor device may be wire bonded or tape bonded to the plurality of leads. In one embodiment, the lead frame further includes a die pad, with the semiconductor device being secured to the die pad. In another embodiment, a portion of the semiconductor device is exposed from the package body. Alternatively, the I/O pads on the semiconductor device are soldered to bond sites on second interposers, which are attached to the plurality of leads for forming a flip-chip attachment. Support posts may be disposed beneath the bond sites on the first and/or second interposers, with the support posts being exposed at a surface of the package body.

In another aspect, a semiconductor device package comprises: a molding compound forming at least a portion of a first package face; at least one passive device at least partially covered by the molding compound; a semiconductor device at least partially covered by the molding compound, the semiconductor device including a plurality of I/O pads; and a lead frame formed from electrically conductive material and partially covered by the molding compound. The lead frame includes: a plurality of leads, each having a first surface forming a bond site electrically connected to at least one I/O pad in the plurality of I/O pads and a second surface exposed at the first package face, and a plurality of interposers electrically connected to the at least one passive device. The plurality of interposers each has a third surface coplanar with the first surfaces of the plurality of leads, and at least a portion of each interposer in the plurality of interposers being spaced apart from the first package face.

In yet another aspect, a method of forming a semiconductor device package comprises: forming a lead frame from an electrically conductive material, including: forming a plurality of leads and a plurality of first interposers in the conductive material, and etching a bottom surface of the plurality of leads and the plurality of interposers, the etching defining a plurality of first surfaces on the leads; electrically connecting I/O pads on a semiconductor device to the plurality of leads; electrically connecting at least one passive device across pairs of first interposers in the plurality of interposers; and covering at least a portion of each of the lead frame, the semiconductor device, and the at least one passive device with a molding compound. The molding compound forms at least a portion of a first package face. The first surface of each lead is exposed at the first package face and at least a portion of each first interposer is spaced apart from the first package face.

The I/O pads on the semiconductor device may be wire bonded or tape bonded to the plurality of leads. Forming the lead frame may further include forming a die pad from the electrically conductive material. In this embodiment, the method further comprises securing the semiconductor device to the die pad. In another embodiment, a portion of the semiconductor device is exposed at the first package face. In yet another embodiment, electrically connecting the I/O pads on the semiconductor device to the plurality of leads includes soldering the I/O pads to bond sites on the lead frame for forming a flip-chip attachment. In this embodiment, forming the lead frame may further include forming a plurality of second interposers connected to the plurality of leads, with the bond sites being formed on the second interposers. Also in this embodiment, the etching may further define support posts disposed beneath the bond sites on the second interposers, with the support posts being exposed at the first package face after the covering with the molding compound.

In the method, the etching may further define a support post extending from at least one of the first interposers in the plurality of first interposers, with the support post being exposed at the first package face after the covering with the molding compound. The support post and the first surface of each lead may be adhered to a surface before covering with the molding compound.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The invention will be more fully understood from the following detailed description taken in conjunction with the accompanying drawings wherein like elements are numbered alike, and in which.

DETAILED DESCRIPTION OF THE PREFERRED EMBODIMENTS

Figure 1:
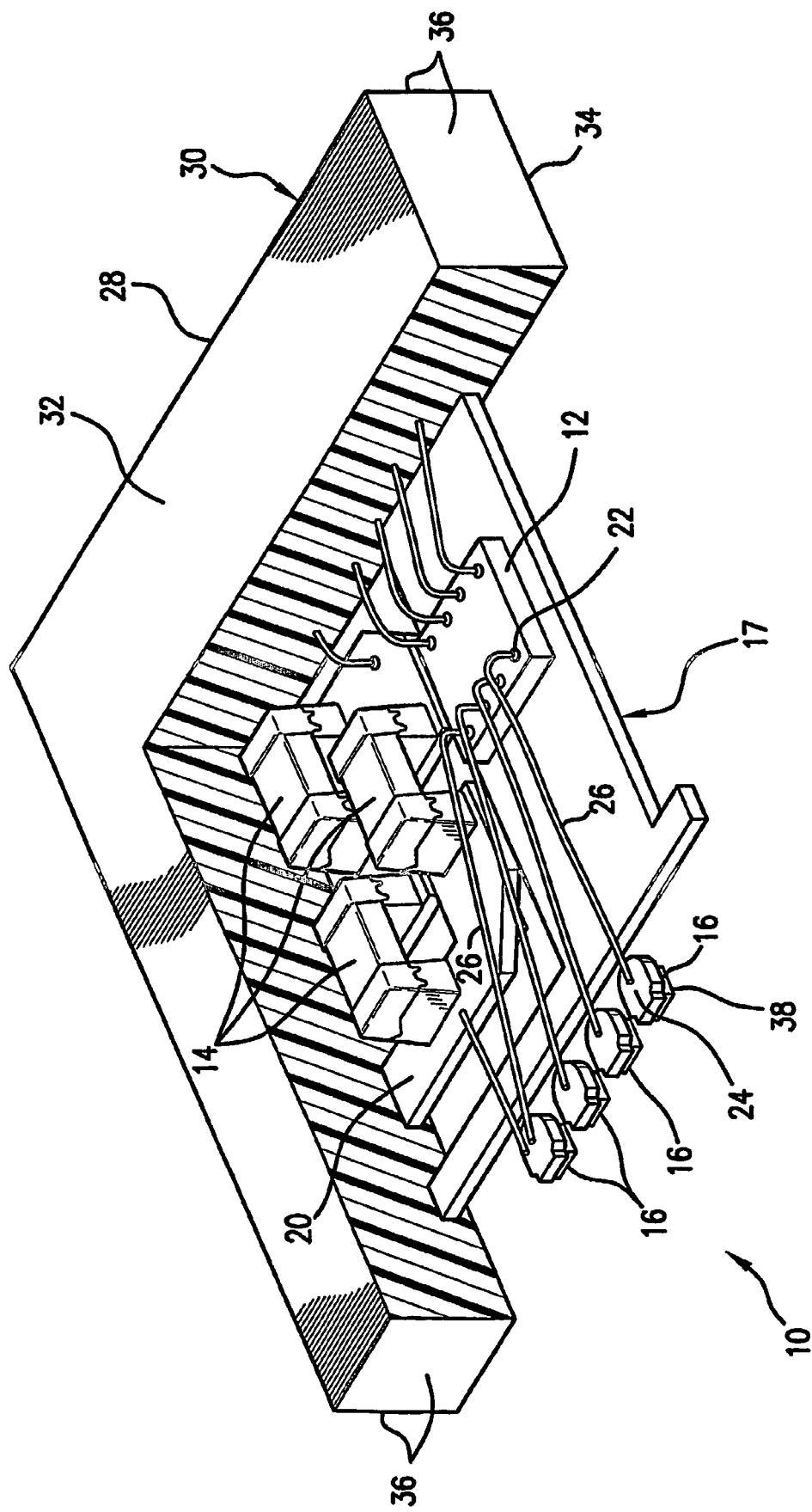
FIG. 1 is a perspective, partial cross sectional view of a lead frame based semiconductor device package with included passive devices in accordance with one embodiment of the present invention.

FIG. 1 is a partial cut-away view of a semiconductor device package 10 including a semiconductor device (die) 12 and passive devices 14 electrically connected to a common lead frame 17. The lead frame 17 is formed from a stamped and/or etched metallic structure and includes a plurality of conductive leads 16 and a plurality of interposers 20. The passive devices 14, which may include capacitors, inductors, resistors, or any other such passive electronic device, are electrically connected to the interposers 20. In the embodiment shown, I/O pads 22 on the die 12 are electrically connected to bond sites 24 formed on the leads 16 by wires 26; however, as will be described in further detail hereinafter, other methods of electrically connecting the I/O pads 22 and bond sites 24 may be used. Also in the embodiment shown, the lead frame 17 includes a die support pad 54, upon which the die 12 is mounted. The die 12, passive devices 14, wires 26, and lead frame 17 are encapsulated in a molding compound 28, which forms a package body 30 having top, bottom, and side surfaces (faces) 32, 34, and 36, respectively. Bottom surfaces 38 of the leads 16 are exposed at the bottom face 34 of the package 10, and may be electrically connected to an external circuit, such as a printed circuit board or the like.

Figure 2:
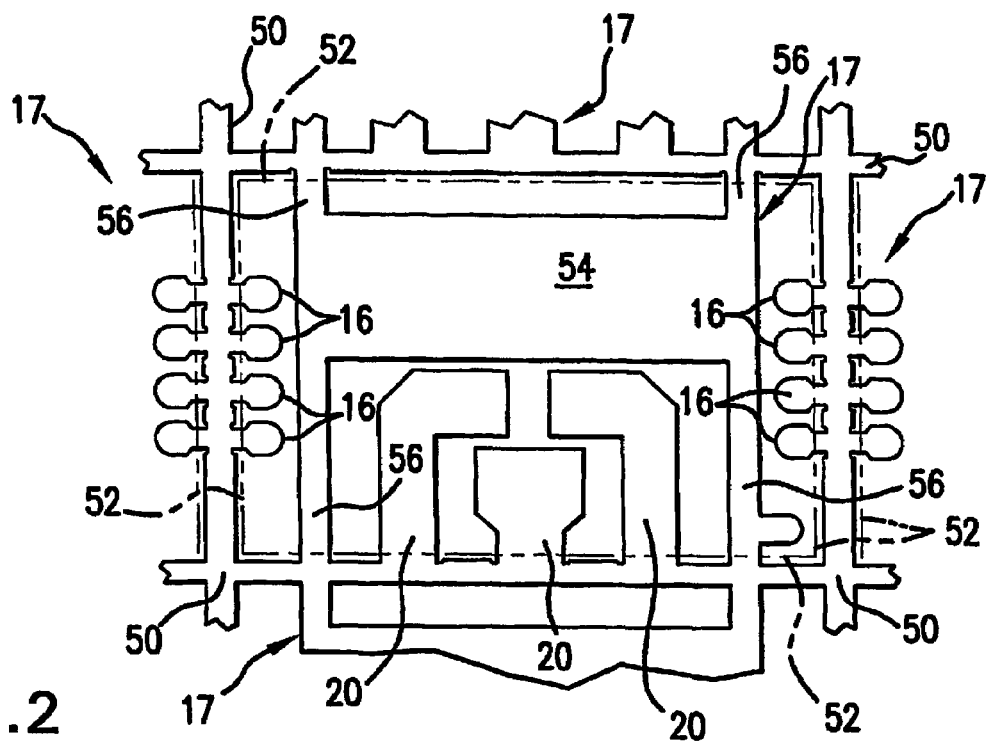
FIG. 2 is a top view of a lead frame for the device of FIG. 1.
Figure 3:
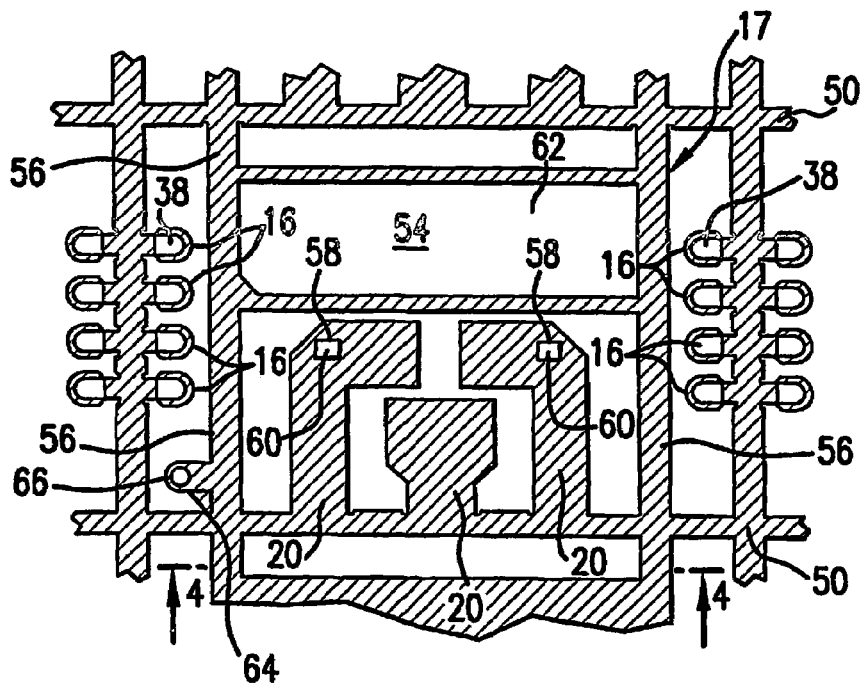
FIG. 3 is a bottom view of the lead frame of FIG. 2.
Figure 4:
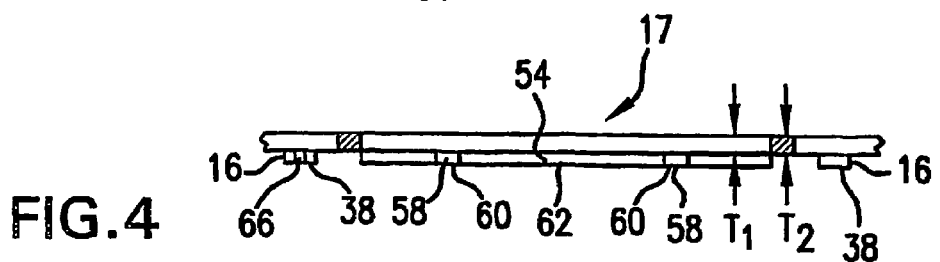
FIG. 4 is a side elevation view of the lead frame taken along section 4-4 of FIG. 3.

FIG. 2 is a top view of the lead frame 17 shown before a singulation step in the semiconductor device package manufacturing process. FIG. 3 is a bottom view of the lead frame 17 of FIG. 2, and FIG. 4 is a side elevation view of the lead frame 17 taken along section 4-4 of FIG. 3. As can be seen in FIG. 2, a number of lead frames 16 may be interconnected by an outer frame 50 to facilitate the manufacture of multiple packages 10. During the singulation step, which is typically performed after the molding compound 28 (FIG. 1) is applied, the lead frames 16 are cut along lines 52 to remove the outer frame 50 and separate the individual lead frames 16.

In the lead frame 17 shown in FIGS. 2-4, four leads 16 are disposed on two opposing sides of a die support pad (die pad) 54. Extending from each corner of the die pad 54 is a tie bar 56, which acts to anchor the die pad 54 within the molding compound 28 (FIG. 1). Disposed in a space formed between two of the tie bars 56 are the interposers 20. In the embodiment shown, the lead frame 17 includes two generally L-shaped interposers 20, with a generally T-shaped interposer 20 disposed in a space between the two generally L-shaped interposers 20. It will be appreciated that the number and configuration of the interposers 20 may be altered as needed for the type of passive devices 14 (FIG. 1). In addition, it will be appreciated, that the number, configuration, and location of the leads 16 may be modified as needed for a particular application. For example, while the leads 16 are shown as being positioned near the perimeter of the bottom surface 34 of the package 10, the leads 16 may alternatively be positioned at other locations on the bottom surface 34. The leads 16 and interposers 20 are spaced apart from each other and from the die pad 54 such that the leads 16 and interposers 20 are electrically isolated from each other and from the die pad 54 after the singulation process.

As shown in FIGS. 3 and 4, extending from the bottom of each generally L-shaped interposer 20 is a support post 58, which has a bottom surface 60 coplanar with the bottom surface 38 of the leads 16 and a bottom surface 62 of the die pad 54. A tab 64 disposed on one of the tie bars 56 includes an identification post 66 extending therefrom, the bottom of which is coplanar with the bottom surfaces of the leads 16, die pad 54, and support posts 58.

The lead frame 17 maybe formed from a sheet of any suitable electrically conductive material, preferably copper or a copper-base alloy. By copper-base alloy it is meant that the material contains more than 50%, by weight, of copper. The sheet of conductive material forming the lead frame 17 preferably has a thickness, indicated at T1 in FIG. 4, of between about 0.10 mm to about 0.25 mm, and more preferably between about 0.15 mm to about 0.20 mm. Precursors for each of the features of the lead frame 17, including the die pad 54, the leads 16, interposers 20 and tie bars 56 may be formed using any known method such as stamping, chemical etching, laser ablation, or the like. The lead frame 17 includes a region of reduced thickness, which is indicated by cross-hatching in FIG. 3 and at T2 in FIG. 4. The reduction in material thickness to form the reduced thickness region may be formed using a controlled subtractive process such as chemical etching or laser ablation. For example, each surface intended to form the bottom surfaces 38, 60, and 62 of the leads 16, support posts 58, and die pad 54, respectively, may be coated with a chemical resist and the uncoated surface exposed to a suitable etchant for a time effective to remove sufficient material to achieve the thickness T2. The thickness T2 is preferably between about 25% to about 60% of the thickness T1 of the lead frame 17 (i.e., the thickness of the material used to form the lead frame), and more preferably between about 40% to about 50% of this thickness. Thicknesses within this preferred range provide sufficient clearance beneath the reduced thickness portion to accept the molding compound for locking the lead frame 17 within the package 10.

Figure 5:
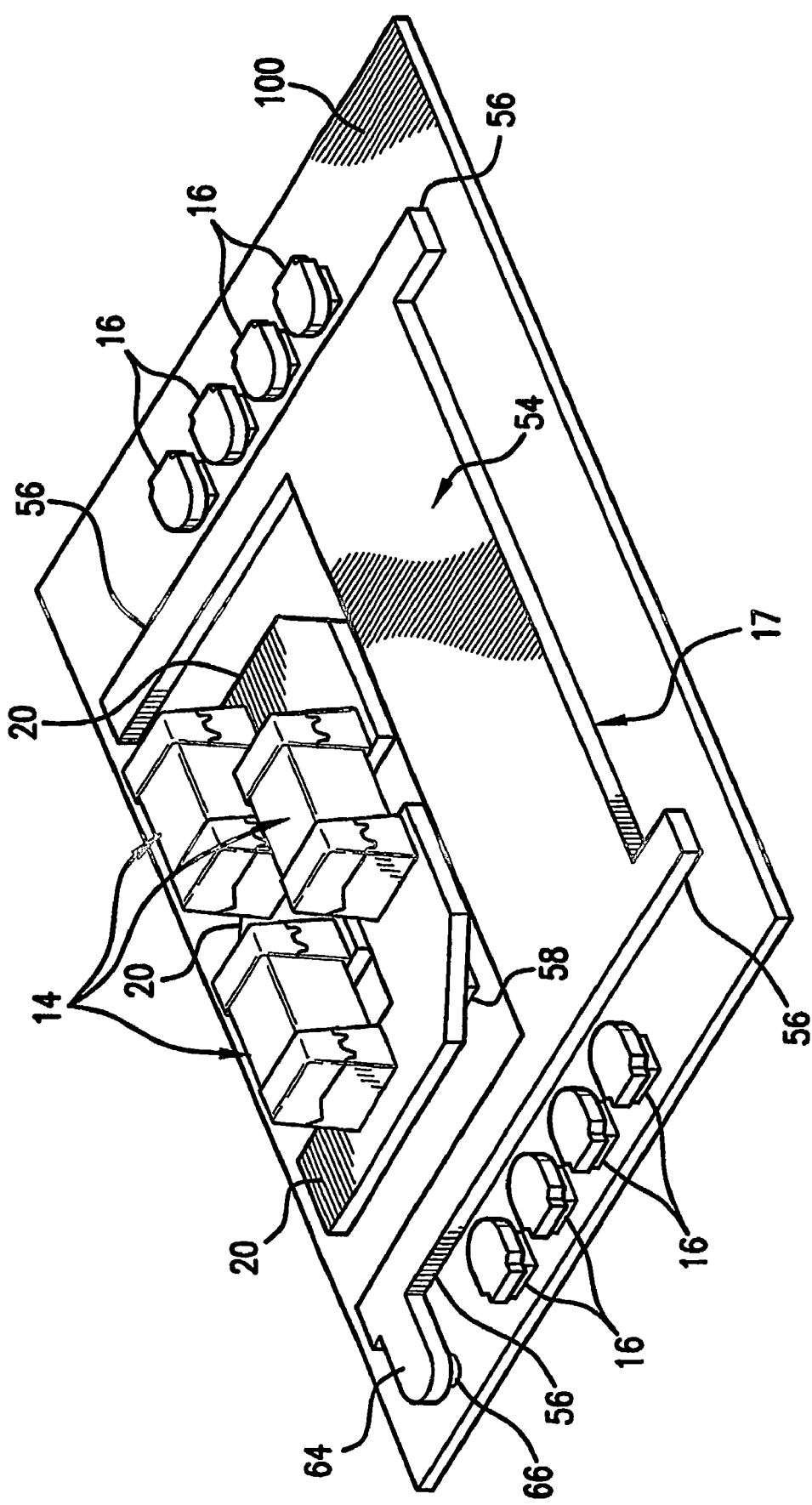
FIG. 5 is a perspective view of the lead frame of FIG. 2 having passive devices connected thereto.

After the various features of the lead frame 17 have been formed, the bottom surfaces of the support posts 58, the leads 16, and the die pad 54 are adhered to a surface 100, which is shown in FIG. 5. In the embodiment shown, the surface 100 is formed on an adhesive tape, which contacts and secures the substantially coplanar surfaces 60, 38, and 62 formed bottom surfaces of the support posts 58, leads 16, and die pad 54, respectively. While FIG. 5 shows a single lead frame 17, it will be appreciated that a plurality of interconnected lead frames 16 may be provided, as shown in FIGS. 2 and 3.

With the lead frame 17 adhered to the surface 100, the passive devices 14 may then be electrically connected to the lead frame 17. In the embodiment shown, each passive device 14 extends from one interposer 20 to another, spanning a space between the interposers 20. For example, two passive devices 14 are electrically connected between the generally L-shaped interposers 20 and the generally T-shaped interposer 20, while one passive device 14 is electrically connected between the generally L-shaped interposers 20. The passive devices 14 may be attached to the interposers 20 using any convenient means such as, for example, soldering, electrically conductive adhesive or epoxy, or the like. Advantageously, one lead frame 17 design may be used for any number of different types of interposers 14.

Figure 6:
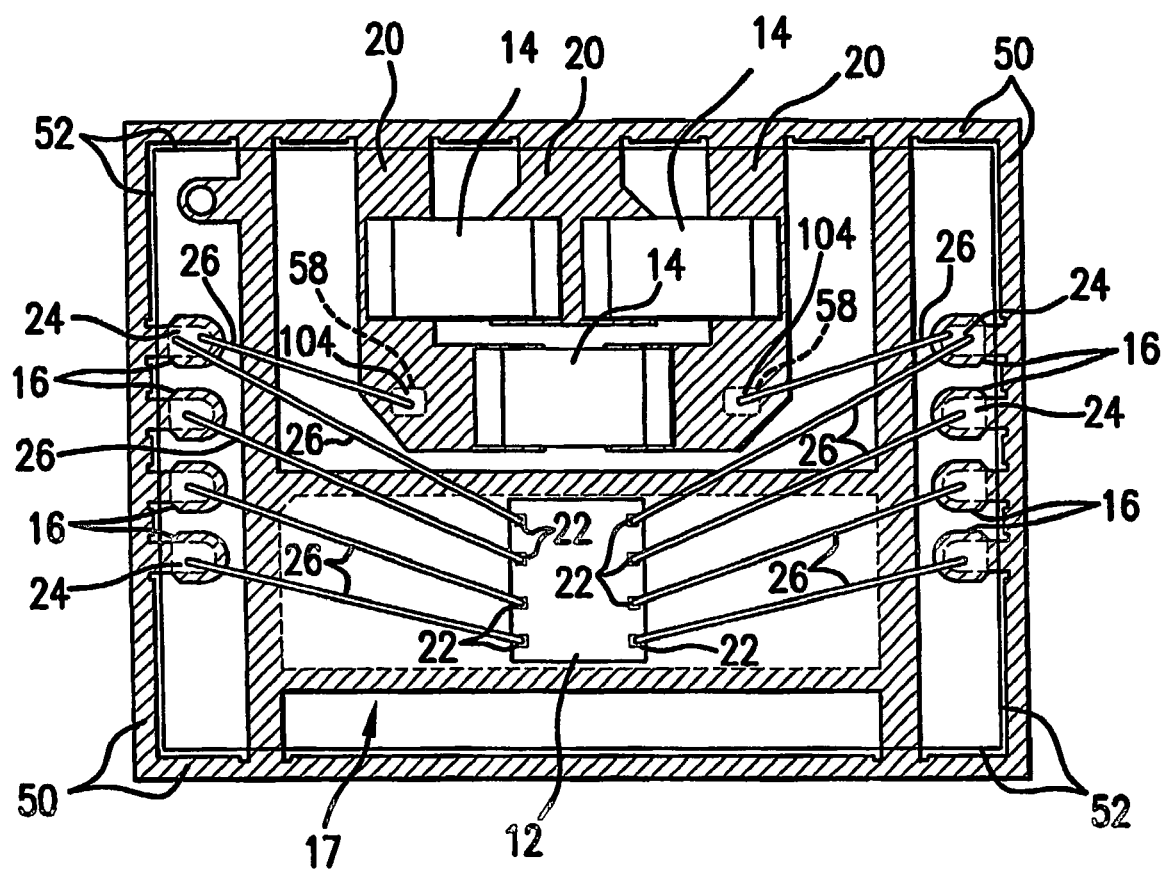
FIG. 6 is a top view of the lead frame of FIG. 2 having a die and passive devices connected thereto.

FIG. 6 is a top view of the lead frame 17 after wires 26 are bonded to the I/O pads 22 on die 12, bond sites 24 on the leads 16, and bond sites 104 on the interposers 20. Before wire bonding, the die 12 is secured to the die pad 54 using any convenient method, such as solder, epoxy, double-sided adhesive tape, and the like. After the die 12 is secured to the die pad 54, wires 26 are individually connected between I/O pads 22 on the die 12 and the bond sites 24 on the respective leads 16, and between bond sites 104 on the interposers 20 and bond sites 24 on one or more leads 16. The support posts 58 are positioned beneath the bond sites 104 on the interposers 20 to maintain coplanarity of the bond sites 104 with the leads 16, allowing precise bonding of the wires 26 and, therefore, reducing defects in the manufacture of the package 10. In addition, the support posts 58 transmit the force associated with the bonding of the wires 26 onto the surface 100 (FIG. 5), thus allowing a wide variety of wire bonding methods to be used. For example, the wire bonding may be performed using ultrasonic bonding, where a combination of pressure and ultrasonic vibration bursts are applied to form a metallurgical cold weld; thermocompression bonding, where a combination of pressure and elevated temperature are applied to form a weld; or thermosonic bonding where a combination of pressure, elevated temperature, and ultrasonic vibration bursts are applied to form a weld. The type of wire used in the bonding is preferably made from gold, gold based alloy, aluminum, or aluminum based alloy. As an alternative to wire bonding, tape automated bonding (TAB) may be used.

Figure 7:
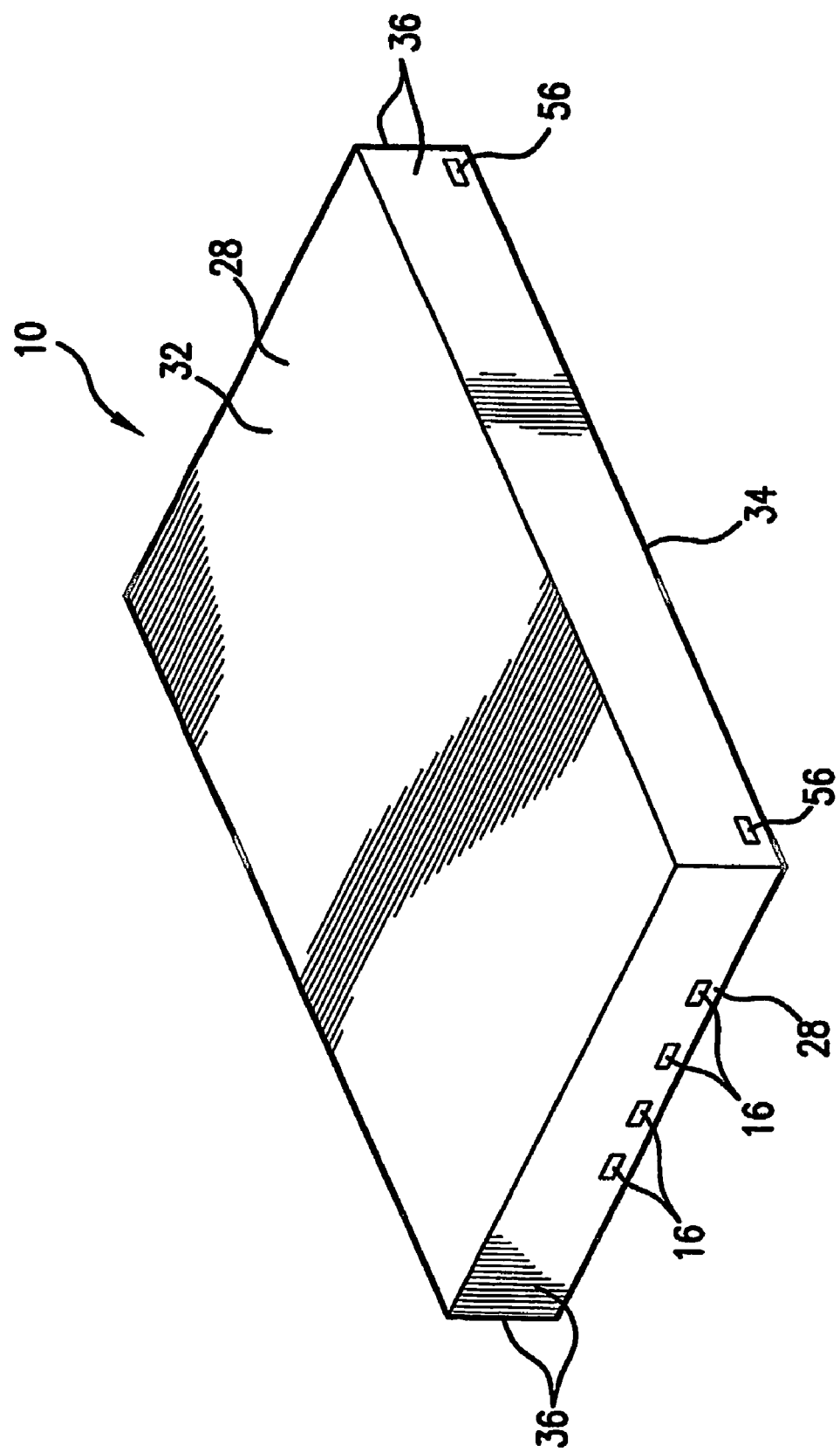
FIG. 7 is a top perspective view of the lead frame based semiconductor device package after singulation.

After the wires 26 are bonded, the die 12, lead frame 17, passive devices 14 and wires 26 are covered with the molding compound 28, as shown in FIGS. 1 and 7. The molding compound 28 may be applied using any convenient technique, such as a transfer or injection molding process. The molding compound 28 is an electrically insulative material, preferably a polymer molding resin, such as an epoxy, having a flow temperature in the range of between about 250° C. to about 300° C. The molding compound 28 may also be a low temperature thermal glass composite.

During application of the molding compound 28, the bottom surfaces 60, 38 and 62 of the support posts 58, leads 16, and die pad 54, respectively, remain adhered to the surface 100 (FIG. 5) to prevent movement of the lead frame 17 and, therefore, help to ensure that the wire bonds are not disturbed or broken. In addition, the space formed beneath the reduced thickness portion of the lead frame 17 accepts the molding compound 28, and acts to anchor the interposers 20, leads 16, and die pad 54 within the package 10.

Figure 8:
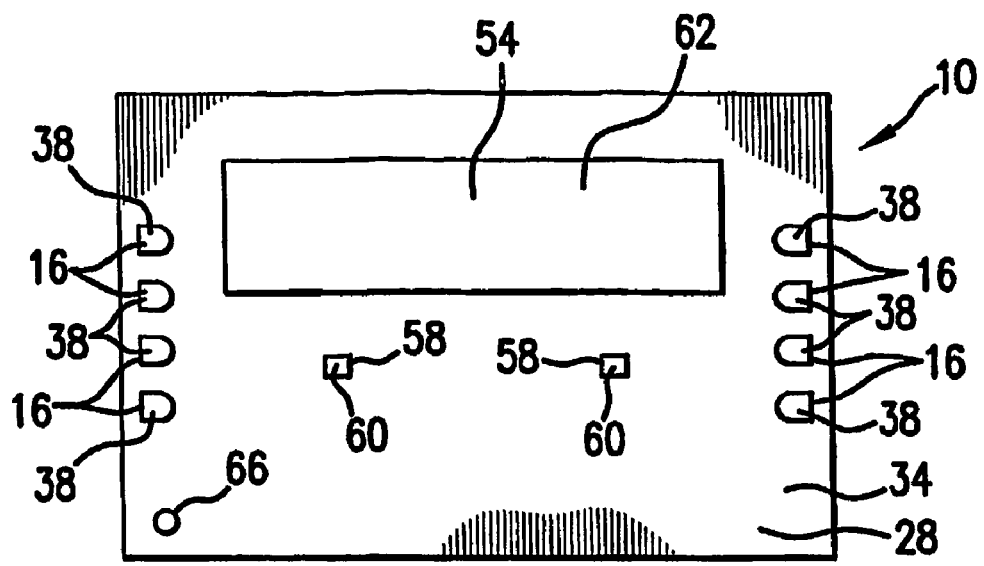
FIG. 8 is a bottom view of the lead frame based semiconductor device package after singulation.

After the molding compound 28 is applied, the adhered surface 100 (FIG. 5) is removed and, if necessary, the attached packages 10 are singulated by punching, or sawing with a blade, water jet, laser, or the like. FIG. 7 is a top perspective view of the package 10 after singulation, and FIG. 8 is a bottom view of the package 10 after singulation. Referring to FIGS. 7 and 8, after removal of the adhered surface 100 (FIG. 5) and singulation, portions of the lead frame 17 of each package 10 are exposed. In particular, a portion of the leads 16, a portion of the interposers 20, and a portion of the tie bars 56, are exposed at side faces 36 of the package 10. As shown in FIG. 8, the bottom surfaces of the die pad 54, leads 16, support posts 58, and identification post 66 are exposed at the bottom surface 34 of the package 10.

In the embodiment shown, the portion of each lead 16 exposed at the side surface 36 is separated from its associated bottom surface 38 by molding compound 28, which forms the entire bottom edge of the package 10. Alternatively, one or more of the leads 16 may be configured such that the portion of the lead 16 exposed at the side surface 36 connects with the bottom surface 38 of the lead 16 at the bottom edge of the package 10. In this embodiment, the one or more lead 16 forms a portion of the bottom edge of the package 10. In a typical arrangement, only the bottom surfaces 38 of the leads 16 will be used for connection to an external electrical circuit. However, the bottom surfaces 60 of the support posts 58 may also be connected to an external circuit if desired.

Figure 9:
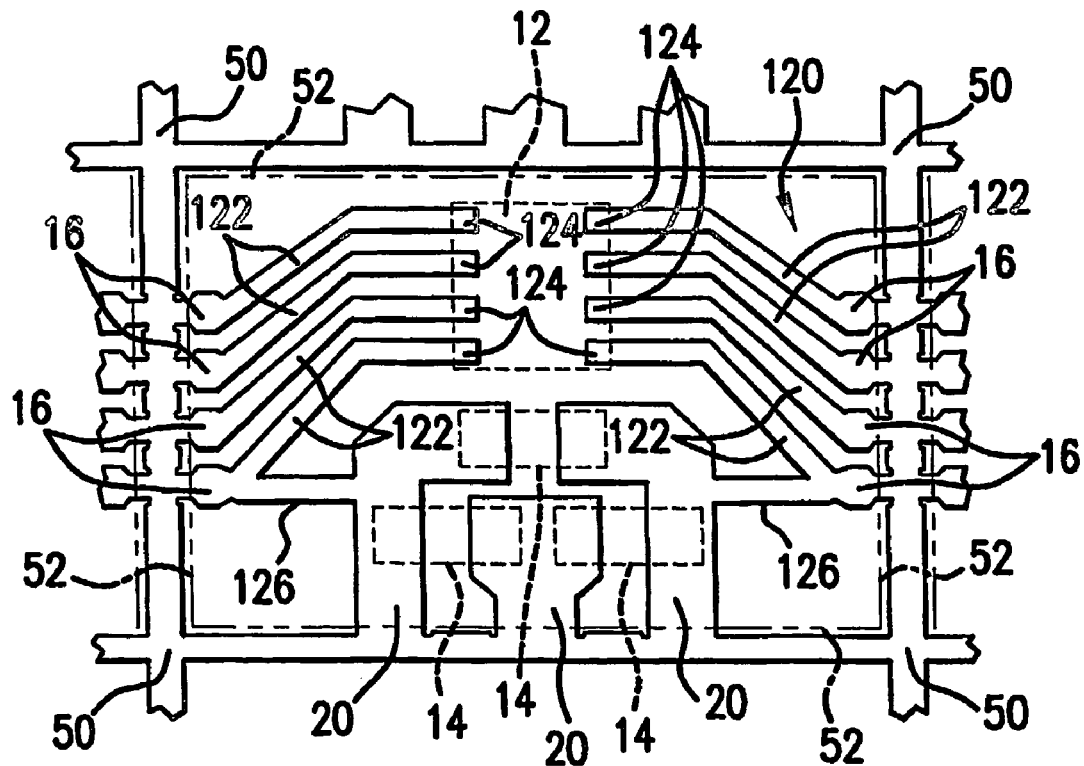
FIG. 9 is a top view of an alternative lead frame for use in the lead frame based semiconductor device package.
Figure 10:
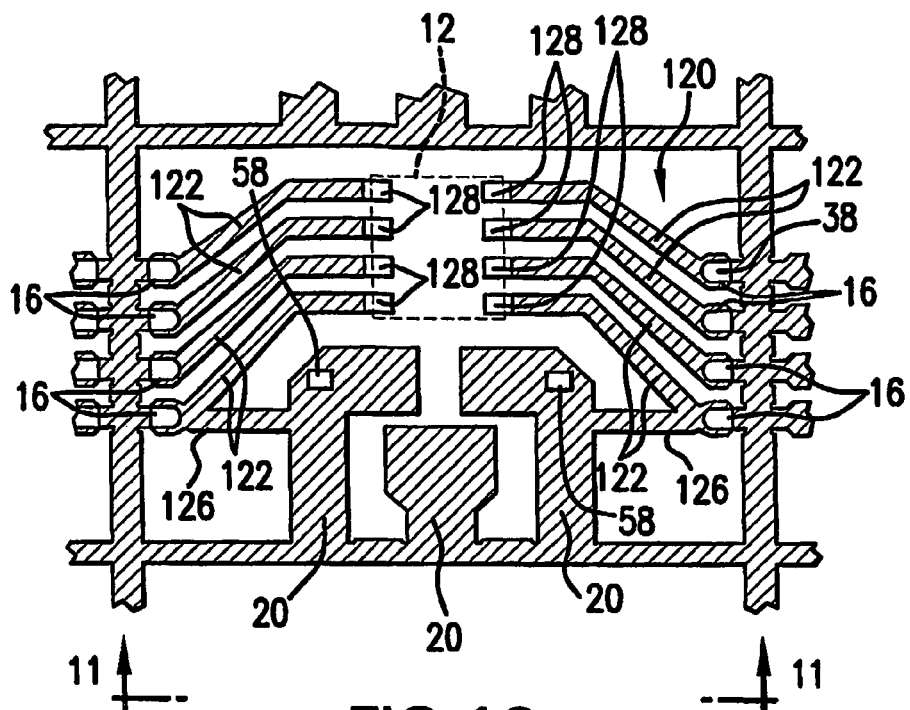
FIG. 10 is a bottom view of the alternative lead frame of FIG. 9.
Figure 11:
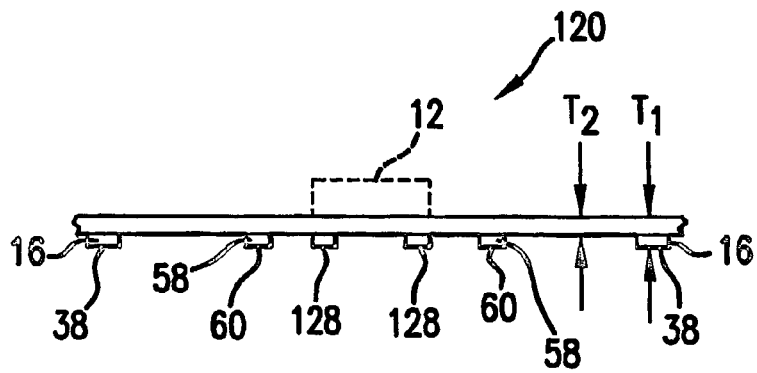
FIG. 11 is a side elevation view of the alternative lead frame of FIG. 9 taken along section 11-11 of FIG. 10.

Referring to FIGS. 9-11, an alternative lead frame 120 for use in the package 10 is shown. Lead frame 120 is substantially similar to the lead frame 17 shown in FIGS. 2-4, with the exception that the lead frame 120 is configured with interposers 122 for electrical connection between the die 12 and leads 16 in flip-chip fashion. That is, the die 12 is flipped such that the I/O pads 22 (FIG. 1) face downward, and the I/O pads 22 are directly electrically connected by way of soldering or the like to bond sites 124 formed on top of the interposers 122. Optionally, the lead frame 120 may also include interposers 126 extending between the generally L-shaped interposers 20 and one or more leads 16. Support posts 128 are formed beneath the bond sites 124 on the interposers 122 to support the bond sites 124 during the soldering and encapsulation processes.

The addition of the interposers 122 eliminates the need for the die pad 54 of FIGS. 2-4 because the interposers 122 support the die 12 within the package 10. In addition, the addition of interposers 122 and 126 eliminates the need for the wire bonding or tape bonding step described above. Otherwise, the manufacture of the package 10 using the lead frame 120 is substantially similar to that described above, with the resulting package 10 having a bottom surface 34 as shown in FIG. 12.

Figure 12:
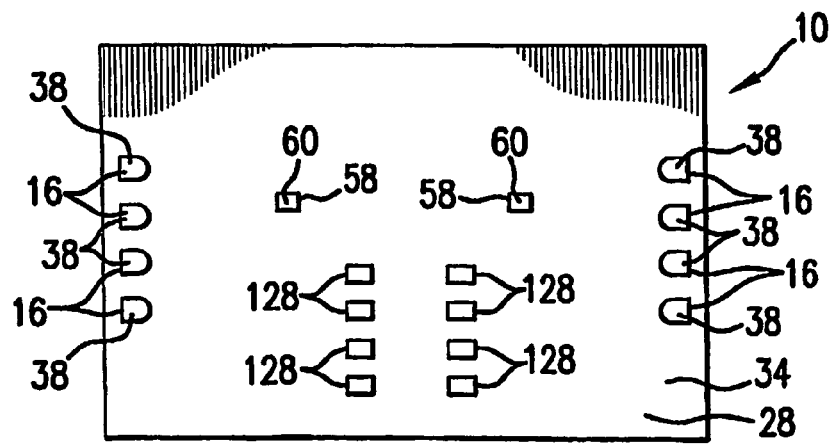
FIG. 12 is a bottom view of the semiconductor device package including the alternative lead frame of FIG. 9.

As shown in FIG. 12, the bottom surfaces of the leads 16, support posts 58, and support posts 128 are exposed at the bottom surface 34 of the package 10. In a typical arrangement, only the bottom surfaces 38 of the leads 16 will be used for connection to an external electrical circuit. However, the bottom surfaces 38 of the support posts 58 and/or 128 may also be connected to an external circuit if desired. Where the bottom surfaces 38 of the support posts 128 are used for connecting to an external circuit, the leads 16 and interposers 122 may be eliminated from the lead frame 120. In this case, the support posts 128 act as the leads for the package 10. As in any of the embodiments described herein, it will be appreciated that the number, configuration, and location of the leads 16 may be modified as needed for a particular application. For example, while the leads 16 are shown as being positioned near the perimeter of the bottom surface 34 of the package 10, the leads 16 may alternatively be positioned at other locations on the bottom surface 34.

Figure 13:
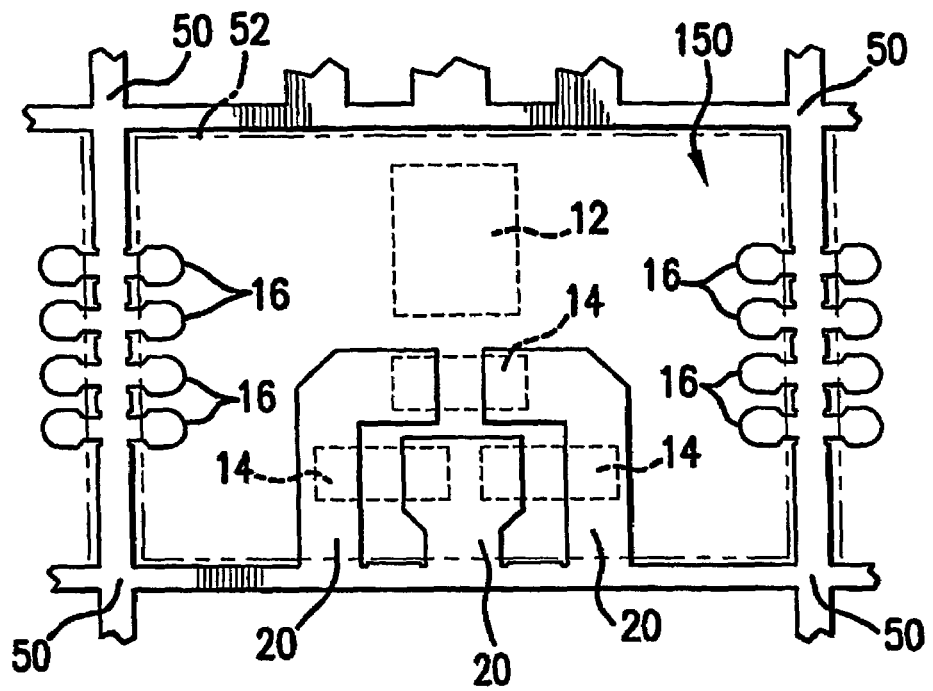
FIG. 13 is a top view of another alternative lead frame for use in the lead frame based semiconductor device package.
Figure 14:
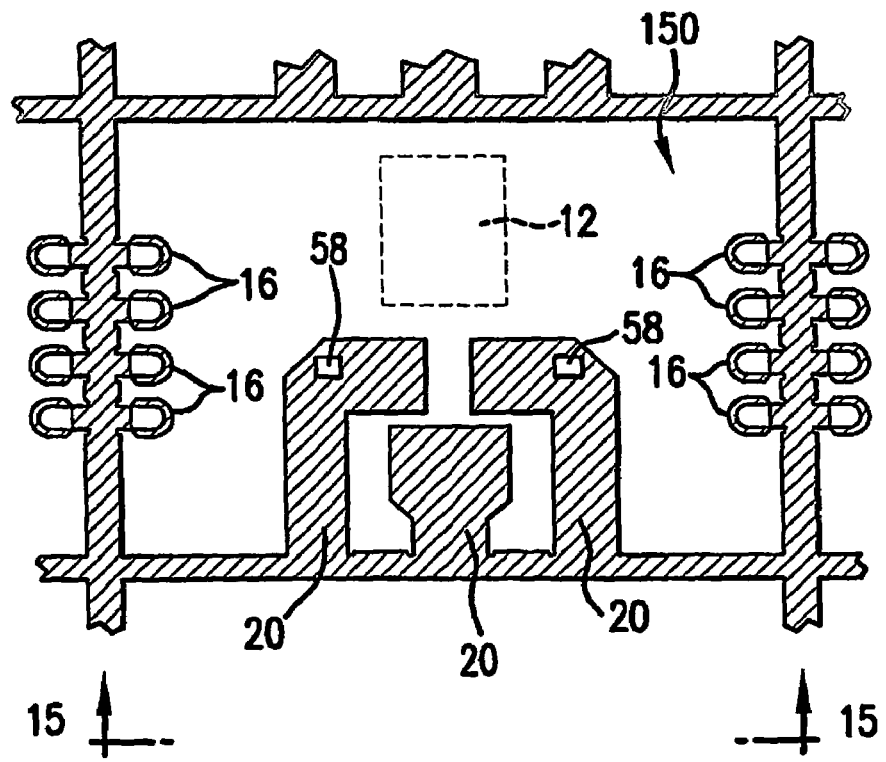
FIG. 14 is a bottom view of the alternative lead frame of FIG. 13.
Figure 15:
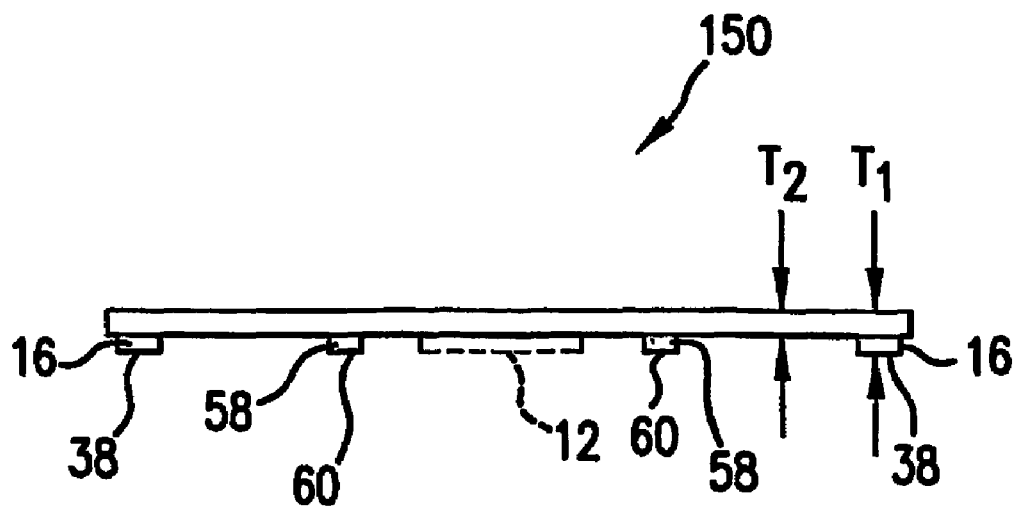
FIG. 15 is a side elevation view of the alternative lead frame of FIG. 13 taken along section 15-15 of FIG. 14.
Figure 16:
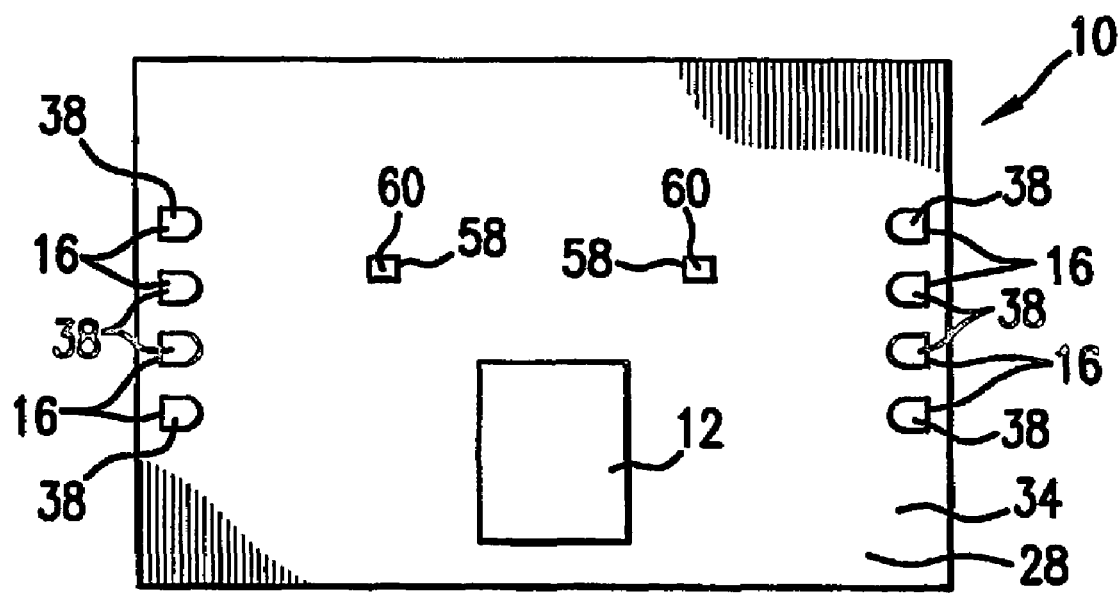
FIG. 16 is a bottom view of the semiconductor device package including the alternative lead frame of FIG. 13.

Referring to FIGS. 13-15, another alternative lead frame 150 for use in the package 10 is shown. Lead frame 150 is substantially similar to the lead frame 17 shown in FIGS. 2-4, with the exception that the lead frame 150 does not include a die pad 54. In this configuration, the die 12 is supported by the surface 100 (FIG. 5) during the wire bonding and encapsulation processes. Otherwise, the manufacture of the package 10 using the lead frame 130 is substantially similar to that described above, with the resulting package 10 having a bottom surface 34 as shown in FIG. 16. The bottom surfaces of the die 12, leads 16, and support posts 58 are exposed at the bottom surface 34 of the package 10.

In any of the embodiments described herein, the passive devices 14 are located in close proximity to the die 12, yielding a package 10 having an overall size that is less than conventional multi-component die packages. The inventors have realized that the inventive configuration demonstrates faster electrical connective between components as there are fewer external leads and shorter wire lengths between the components. The package maybe used as a drop-in replacement to dual flat non-leaded assemblies such as, for example, small outline integrated circuits (SOIC), thin shrink small outline packages (TSSOP), quarter size outline packages (QSOP), and the like.

While the invention has been described and illustrated in connection with preferred embodiments, many variations and modifications, as will be apparent to those of skill in the art, maybe made without departing from the spirit and scope of the invention. By example, it should be appreciated that it is within the scope of the present invention to employ alternate package configurations. Various modifications may include, for example, plating applied before or after die attachment and/or wire bonding.

Accordingly, the teachings of this invention are not intended to be limited to any specific semiconductor die package arrangement, such as the arrangements described in detail above. As such, the invention as set forth in the appended clams is not limited to the precise details of construction set forth above as such other variations and modifications as would be apparent to one skilled in the art are intended to be included within the spirit and scope of the invention as set forth in the defined claims.

What is claimed is:

1. A semiconductor device package (10) configured for electrical connection to an external circuit, the semiconductor device package (10) comprising:
   a package body (30);
   a semiconductor device (12) disposed within the package body (30);
   at least one passive device (14) disposed within the package body (30); and
   a lead frame (17) formed from electrically conductive material, the lead frame (17) including:
      a plurality of leads (16) electrically connected to I/O pads (22) on the semiconductor device (12), each of the leads (16) including a first surface (38) exposed from the package body (30) for electrical connection to the external circuit, and
      a plurality of first interposers (20) electrically connected to the at least one passive device (14), at least one interposer (20) in the plurality of interposers (20) being electrically connected to at least one lead (16) in the plurality of leads (16) for electrically connecting the at least one passive device (14) with the external circuit,
   wherein at least one of the first interposers (20) in the plurality of first interposers (20) includes a support post (58) extending therefrom, the support post (58) being exposed at a surface (34) of the package body (10).

2. The semiconductor device package (10) of claim 1, wherein the package body (30) is formed by a molding compound (28) encapsulating at least a portion of the semiconductor device (12), at least a portion of the at least one passive component (14), and at least a portion of the lead frame (17).

3. The semiconductor device package (10) of claim 2, wherein the first surfaces (38) of the leads (16) are exposed substantially coplanar with a surface (34) of the package body (30).

4. The semiconductor device package (10) of claim 1, wherein the at least one passive device (14) is selected from the group consisting of capacitors, inductors, and resistors.

5. The semiconductor device package (10) of claim 1, wherein the lead frame (17) further includes a die pad (54), the semiconductor device (12) being secured to the die pad (54).

6. The semiconductor device package (10) of claim 1, wherein a portion of the semiconductor device (12) is exposed from the package body (30).

7. The semiconductor device package (10) of claim 1, wherein the I/O pads (22) on the semiconductor device (12) are soldered to bond sites (124) on the lead frame (17) for forming a flip-chip attachment.

8. The semiconductor device package (10) of claim 7, wherein the bond sites (124) are formed on second interposers (122) connected to the plurality of leads (16).

9. The semiconductor device package (10) of claim 8, wherein the second interposers (122) each include a support post (128) disposed beneath the bond sites (124), the support posts (128) being exposed at a surface (34) of the package body (10).

10. The semiconductor device package (10) of claim 8, wherein the at least one interposer (20) in the plurality of interposers (20) is electrically connected to at least one lead (16) in the plurality of leads (16) by at least one third interposer (126).

11. The semiconductor device package (10) of claim 1, wherein the I/O pads (22) on the semiconductor device (12) are wire bonded or tape bonded to the plurality of leads (16).

12. A semiconductor device package (10) comprising:
a molding compound (28) forming at least a portion of a first package face (34);
at least one passive device (14) at least partially covered by the molding compound (28);
a semiconductor device (12) at least partially covered by the molding compound (28), the semiconductor device (12) including a plurality of I/O pads (22); and
a lead frame formed (17) from electrically conductive material and partially covered by the molding compound (28), the lead frame (17) including:
a plurality of leads (16), each having a first surface forming a bond site electrically connected to at least one I/O pad (22) in the plurality of I/O pads (22) and a second surface (38) exposed at the first package face (34), and
a plurality of first interposers (20) electrically connected to at least one passive device (14), the plurality of first interposers (20) each having a third surface coplanar with the first surfaces of the plurality of leads (16), at least a portion of each first interposer (20) in the plurality of first interposers (20) being spaced apart from the first package face (34).

13. The semiconductor device package (10) of claim 12, wherein the at least one passive device (14) is selected from the group consisting of capacitors, inductors, and resistors.

14. The semiconductor device package (10) of claim 12, wherein the lead frame (17) further includes a die pad (54), the semiconductor device (12) being secured to the die pad (54).

15. The semiconductor device package (10) of claim 12, wherein a portion of the semiconductor device (12) is exposed at the first package face (34).

16. The semiconductor device package (10) of claim 12, wherein the I/O pads (22) on the semiconductor device (12) are soldered to bond sites (124) on the lead frame (17) for forming a flip-chip attachment.

17. The semiconductor device package (10) of claim 16, wherein the bond sites (124) are formed on second interposers (122) connected to the plurality of leads (16).

18. The semiconductor device package (10) of claim 17, wherein the second interposers (122) each include a support post (128) disposed beneath the bond sites (124), the support posts (128) being exposed at the first package face (34).

19. The semiconductor device package (10) of claim 12, wherein at least one of the first interposers (20) in the plurality of first interposers (20) includes a support post (58) extending therefrom, the support post (58) being exposed at the first package face (34).

20. The semiconductor device package (10) of claim 12, wherein the I/O pads (22) on the semiconductor device (12) are wire bonded or tape bonded to the plurality of leads (16).

21. The semiconductor device package (10) of claim 12, wherein at least one lead (16) in the plurality of leads (16) is electrically connected to at least one first interposer (20) in the plurality of first interposers (20).

22. A method of forming a semiconductor device package (10), the method comprising:
forming a lead frame (17) from an electrically conductive material, including:
forming a plurality of leads (16) and a plurality of first interposers (20) in the conductive material, and
etching a bottom surface of the plurality of leads (16) and the plurality of first interposers (20), the etching defining a plurality of first surfaces (38) on the leads (16);
electrically connecting I/O pads (22) on a semiconductor device (12) to the plurality of leads (16);
electrically connecting at least one passive device (14) across pairs of first interposers (20) in the plurality of first interposers (20); and
covering at least a portion of each of the lead frame (17), the semiconductor device (12), and the at least one passive device (14) with a molding compound (28), the molding compound (28) forming at least a portion of a first package face (34), wherein the first surface (38) of each lead (16) is exposed at the first package face (34) and at least a portion of each first interposer (20) is spaced apart from the first Package face (34).

23. The method of claim 22, wherein the at least one passive device (14) is selected from the group consisting of capacitors, inductors, and resistors.

24. The method of claim 22, wherein forming the lead frame (17) further includes forming a die pad (54) from the electrically conductive material, and the method further comprises:
securing the semiconductor device (12) to the die pad (54).

25. The method of claim 22, wherein a portion of the semiconductor device (12) is exposed at the first package face (34).

26. The method of claim 22, wherein electrically connecting the I/O pads (22) on the semiconductor device (12) to the plurality of leads (16) includes:
soldering the I/O pads (22) to bond sites (124) on the lead frame (17) for forming a flip-chip attachment.

27. The method of claim 26, wherein forming the lead frame (17) further includes forming a plurality of second interposers (122) connected to the plurality of leads (16), the bond sites (124) being formed on the second interposers (122).

28. The method of claim 27, wherein the etching further defines support posts (128) disposed beneath the bond sites (124) on the second interposers (122), the support posts (128) being exposed at the first package face (34) after the covering with the molding compound (28).

29. The method of claim 22, wherein the etching further defines a support post (58) extending from at least one of the first interposers (20) in the plurality of first interposers (20), the support post (58) being exposed at the first package face (34) after the covering with the molding compound (28).

30. The method of claim 29, further comprising:
adhering the support post (58) and the first surface (38) of each lead (16) to a surface (100) before covering with the molding compound (128).

31. The method of claim 22, wherein electrically connecting the I/O pads (22) on the semiconductor device (12) to the plurality of leads (16) includes:
wire bonding or tape bonding the I/O pads (22) to the plurality of leads (16).

32. The method of claim 22, further comprising:
electrically connecting at least one lead (16) in the plurality of leads (16) to at least one first interposer (20) in the plurality of first interposers (20).

33. A semiconductor device package (10) configured for electrical connection to an external circuit, the semiconductor device package (10) comprising:
a package body (30);

a semiconductor device (12) disposed within the package body (30);

at least one passive device (14) disposed within the package body (30); and a lead frame (17) formed from electrically conductive material, the lead frame (17) including:

a plurality of leads (16) electrically connected to I/O pads (22) on the semiconductor device (12), each of the leads (16) including a first surface (38) exposed from the package body (30) for electrical connection to the external circuit, and a plurality of first interposers (20) electrically connected to the at least one passive device (14), at least one interposer (20) in the plurality of interposers (20) being electrically connected to at least one lead (16) in the plurality of leads (16) for electrically connecting the at least one passive device (14) with the external circuit, wherein a portion of the semiconductor device (12) is exposed from the package body (30).

34. A semiconductor device package (10) configured for electrical connection to an external circuit, the semiconductor device package (10) comprising:

a package body (30);

a semiconductor device (12) disposed within the package body (30);

at least one passive device (14) disposed within the package body (30); and a lead frame (17) formed from electrically conductive material, the lead frame (17) including:

a plurality of leads (16) electrically connected to I/O pads (22) on the semiconductor device (12), each of the leads (16) including a first surface (38) exposed from the package body (30) for electrical connection to the external circuit, and a plurality of first interposers (20) electrically connected to the at least one passive device (14), at least one interposer (20) in the plurality of interposers (20) being electrically connected to at least one lead (16) in the plurality of leads (16) for electrically connecting the at least one passive device (14) with the external circuit, wherein the I/O pads (22) on the semiconductor device (12) are soldered to bond sites (124) on the lead frame (17) for forming a flip-chip attachment.

35. A semiconductor device package (10) configured for electrical connection to an external circuit, the semiconductor device package (10) comprising:

a package body (30);

a semiconductor device (12) disposed within the package body (30);

at least one passive device (14) disposed within the package body (30); and a lead frame (17) formed from electrically conductive material, the lead frame (17) including:

a plurality of leads (16) electrically connected to I/O pads (22) on the semiconductor device (12), each of the leads (16) including a first surface (38) exposed from the package body (30) for electrical connection to the external circuit, and a plurality of first interposers (20) electrically connected to the at least one passive device (14), at least one interposer (20) in the plurality of interposers (20) being electrically connected to at least one lead (16) in the plurality of leads (16) for electrically connecting the at least one passive device (14) with the external circuit, wherein each lead (16) has a second surface substantially coplanar with a surface of the interposer, the first surface (38) displaced from and substantially parallel to the second surface.

* * * * *